United States Patent [19]

Nishi

[11] Patent Number: 4,947,784
[45] Date of Patent: Aug. 14, 1990

[54] APPARATUS AND METHOD FOR TRANSFERRING WAFERS BETWEEN A CASSETTE AND A BOAT

[75] Inventor: Hironobu Nishi, Sagamihara, Japan

[73] Assignee: Tel Sagami Limited, Kanagawa, Japan

[21] Appl. No.: 281,026

[22] Filed: Dec. 7, 1988

[30] Foreign Application Priority Data

Dec. 7, 1987 [JP] Japan .................................. 62-308920

[51] Int. Cl.⁵ .............................................. B65G 65/30
[52] U.S. Cl. .................................... 414/404; 414/417; 414/786
[58] Field of Search .............. 414/404, 416, 417, 786, 414/331, 403

[56] References Cited

U.S. PATENT DOCUMENTS

| | | | |
|---|---|---|---|
| 4,449,885 | 5/1984 | Hertel et al. ..................... | 414/417 X |
| 4,466,766 | 8/1984 | Geren et al. ......................... | 414/404 |
| 4,568,234 | 2/1986 | Lee et al. ........................ | 414/417 X |
| 4,573,851 | 3/1986 | Butter .............................. | 414/417 X |
| 4,611,966 | 9/1986 | Johnson ........................... | 414/417 X |
| 4,701,096 | 10/1987 | Fisher, Jr. ........................ | 414/331 X |
| 4,776,744 | 10/1988 | Stonestreet et al. ............ | 414/417 X |
| 4,778,331 | 10/1988 | Kimata et al. ................... | 414/417 X |
| 4,787,806 | 11/1988 | Aupperle .............................. | 414/416 |
| 4,840,530 | 6/1989 | Nguyen ........................... | 414/417 X |

Primary Examiner—David A. Bucci
Attorney, Agent, or Firm—Oblon, Spivak, McClelland, Maier & Neustadt

[57] ABSTRACT

An apparatus for transferring wafers comprises a turntable for orienting a plurality of wafers which are loaded in a cassette, a lifting mechanism for lifting the wafers away from the cassette, a plurality of opening/closing chuck mechanisms, and a slide movement mechanism for conveying the wafers which are held by the opening/closing mechanism onto a boat. The cassette on the turntable is turned selectively through an angle of 180° and wafers are lifted by the link mechanism all at a time and selectively held by the opening/closing chuck mechanism. The wafers thus held are conveyed to a location of a boat where they are loaded onto the boat in a face-to-face relation.

18 Claims, 8 Drawing Sheets

APPARATUS AND METHOD FOR TRANSFERRING WAFERS BETWEEN A CASSETTE AND A BOAT

BACKGROUND OF THE INVENTION

1. Field of the Invention

The present invention relates to an apparatus and method for transferring semiconductor wafers, between a cassette and a boat for heat treatment.

2. Description of the Related Art

Semiconductor devices, such as IC's or LSI's are manufactured by subjecting wafers cut from an ingot to various sequential steps, such as a surface treatment, thermal oxidation, impurity diffusion, film deposition and etching step, during which the semiconductor wafers repetitively undergo heat treatments (heating, CVD, oxidation, diffusion and other treatments) a plurality of times.

As a wafer heating furnace use is made of a vertically-stacked multi-stage furnace, such as a four-state furnace, to heat-treat the semiconductor wafers. A multi-stage stack unit is provided in front of the furnace and various automatic devices are mounted on the stack unit to treat the semiconductor wafers.

For the semiconductor wafers to enter or leave the heating furnace, a special quartz boat is employed in which case semiconductor wafers can be carried 200 pieces at max. per lot on a single boat. A special wafer-cassette (carrier) is used to convey semiconductor wafers to the heating furnace via a preliminary step. Usually, the cassette can hold 25 pieces of semiconductor wafers at max. per lot. Thus semiconductor wafers on a respective cassette are transferred onto one boat.

The wafer must carefully be handled so that no contamination occurs due to a direct touching of the operator's hand on the wafer. To this end, a special wafer transfer apparatus is located, as its auxiliary equipment near the inlet of the furnace to allow ready transfer to be automatically made from the cassette to the boat or from the boat to another cassette for washing.

Japanese patent application (Kokoku) 60-32352 discloses a conventional wafer transfer apparatus including a table carrying a boat and cassettes thereon and a loading device for handling the wafers between the cassette and the boat. The table extends in the X-axis direction, that is, in the direction of the axis of the furnace. Furthermore, the wafer transfer apparatus includes a travelling mechanism for travelling the table along the X-axis direction and stepping mechanism for stepping the table in the X-axis direction at a rate of one pitch corresponding to each groove which is formed on the boat to load the respective wafer.

The loading device includes a wafer-lifting mechanism liftably mounted below the table and is adapted to lift the wafers on the boat and cassette upwardly and a wafer-gripping mechanism having a pair of wafer chucks adapted to be opened and closed.

When the wafers in the cassette are to be transferred to the boat by the apparatus, a plurality of cassettes are arranged on a stage, all wafers in a first cassette being lifted up by the wafer-lifting mechanism away from the cassette, gripped by the chuck mechanism all at a time, carried on the boat and placed onto the boat with the chuck mechanism opened. The wafers on a second cassette et seq. are sequentially transferred to the corresponding boat in substantially the same fashion as set forth above. Then the boat carrying the wafers thereon is placed by an elevator device on a carrier located in front of the furnace, and loaded by a soft landing device into horizontal type furnace or by a boat loader into vertical type furnace.

The aforementioned sequential operation of the wafer transfer device is controlled, by a computer, based on a predetermined programming.

The cassette, boat and wafer chuck are of such a type that grooves are formed at the same interval to hold the respective wafer.

Since, however, wafers on the cassette are held all in the same direction on the aforementioned wafer transfer apparatus, the pattern formation surface and reverse surface of the wafers face each other if the wafers in the cassette are transferred to the boat all at a time. This sometimes offers a disadvantage in the case where the pattern formation surfaces of the wafers are arranged in an opposed relation called a "face-to-face" array or the reverse surfaces of the wafers are arranged in an opposed relation called a "back-to-back" array.

Furthermore, it is not possible to rapidly cope with the situation where there is a change in the pitch of those grooves of the boat where the wafers are held in place. If the groove pitch is changed, for example, from 3/16 inch to 3/32 inch, then it is necessary to change the groove pitch on the wafer chuck from 3/16 inch to 3/32 inch accordingly. For the chuck exchange, the task time is prolonged because the wafer transfer operation is interrupted over a long period of time.

SUMMARY OF THE INVENTION

It is accordingly an object of the present invention to provide an apparatus and method which can transfer wafers in a cassette to a boat on a face-to-face, or a back-to-back, relation.

Another object of the present invention is to provide an apparatus which can transfer those wafers which are arranged at a different pitch unit to a destination without changing associated component.

According to an aspect of the present invention, an apparatus for transferring wafers is provided which comprises means for selectively turning a plurality of wafers loaded on first wafer-loading means (wafer cassette), means for selectively taking out the wafers from the first wafer-loading means, means for selectively holding the wafers thus taken and means for conveying the wafers which are thus taken onto second wafer-loading means (wafer boat).

The turning means includes a turntable for turning the wafer cassette around a vertical axis. It is preferable that the turntable carrying the cassette thereon be turned around a vertical axis through an angle of 180°.

It is also preferable that a plurality of such turntables be arranged in series with a cassette stage.

It is desirable that the turning means be controlled by a computer system. In this case, the cassette is selectively rotated by the turning means to a given direction on the basis of a predetermined computer programming.

The holding means preferably includes a plurality of opening/closing chuck mechanisms. In this way, two types of holding means are preferably provided such that they are different in the pitch of grooves thereon.

According to an aspect of the present invention, a method for transferring wafers, comprising the steps of lifting, wafers in an array off a cassette which holds the wafers, selectively removing at least one wafer from the lifted array and loading the at least one wafer to a boat, returning a wafer or wafers remaining on the lifted array to the cassette, turning the cassette about its axis by 180°, lifting the remaining wafers in an array off the cassette, selectively removing at least one remaining wafer from the lifted array and loading the at least one remaining wafer to the boat.

The cassette is selectively rotated by the turning means and the wafers are selectively held by the holding means and sequentially transferred to the corresponding boat on a face-to-face or a back-to-back relation.

DETAILED DESCRIPTION OF THE PREFERRED EMBODIMENTS

A wafer transfer apparatus according to various embodiments of the present invention will be explained below with reference to the accompanying drawings.

Figure 1:
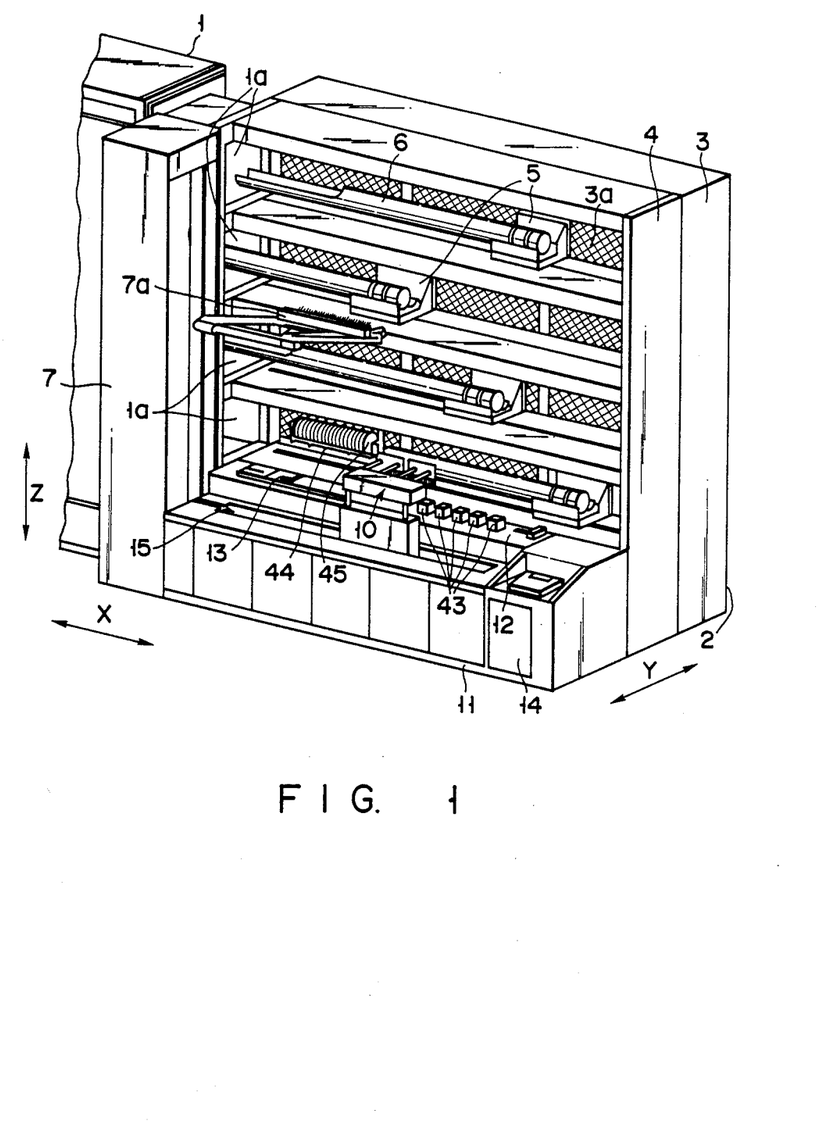
FIG. 1 is a perspective view showing an auxiliary equipment which is installed near the inlet of a heating furnace.

As shown in FIG. 1, heating furnace equipment 1 is of a multi-stage type which is made up of four furnace units vertically stacked one over another. A plurality of process tubes, not shown, are serially inserted across the respective furnace in a lateral array. The heating furnace equipment is adapted to subject silicon wafers to an oxidation/diffusion step.

Carrier 2 for allowing the entering and leaving of boats is disposed to communicate with inlet 1a of the heating furnace equipment. The carrier includes filter unit 3 having air filter 3a and unit 4 for allowing boats 44 which hold a greater number of wafers 45 thereon to enter and exit heating furnace equipment 1 via inlet 1a. Unit 4 is of such a 4-stage type that each of four shelves can communicate at one end with inlet 1a. Soft landing unit 5 is provided on each shelf and has fork 6 made of quartz. Soft landing unit 5 has a mechanism for slidably moving fork 6 along the longitudinal (X-axis) direction and mechanism for nodding the forward end of fork 6 up and down. Fork 6 is bifurcated at the forward end portion where boat 44 is held in place.

Elevator device 7 is disposed, on the front side, at a location between heating furnace equipment 1 and carrier 2. Member 7a is disposed at the arm end of elevator device 7 and adapted to allow boat 44 which is placed on boat stage 13 to be transferred to the forward portion of fork 6. Elevator device 7 has a mechanism for moving member 7a along the X- and Z-axis directions.

Box-type housing 11 is located at a front portion of the bottom most shelf such that it is arranged along that shelf. First stage 12 for placing the cassette thereon and second stage 13 for placing the boat thereon are provided in a serial fashion on the top surface of housing 11 in the X-axis direction. First and second stages 12 and 13 are located on the same line and at the same elevation.

Grooves are formed at a predetermined interval on the inner side walls of cassette 43 to allow wafers to be inserted and held therein. 25 grooves for holding wafers are provided, as such, at a pitch of 3/16 inch.

Figure 2:
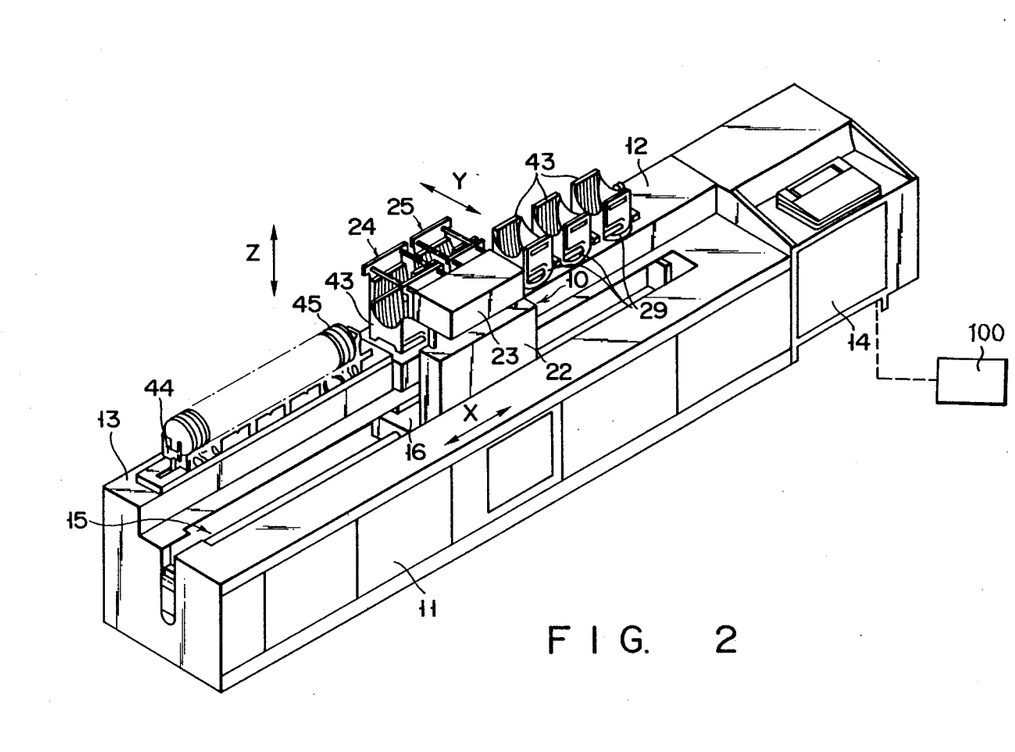
FIG. 2 is a perspective view showing an apparatus according to an embodiment of the present invention.

As shown in FIG. 2, a plurality of cassettes 43 are located on first stage 12 so as to allow the grooves for holding wafers in place to be oriented in the Y-axis direction. A plurality of cassette-rotation mechanisms 29 are located at an equal interval on the first stage 12 to allow cassettes 43 which are placed thereon to be changed in their rotation direction.

One boat 44 is placed on second stage 13 and two kinds of grooves, one for 12/16-inch pitch and the other for 3/16-inch pitch, are alternately formed on boat 44.

Opening 15 is provided, in the X-axis direction, on the "front side" portion of housing 11 and an upper mechanism of loading device 10 is so provided that it extends through opening 15. Loading device 10 is movable, in the X-axis direction, along first and second stages 12 and 13 over substantially the whole length of housing 11. Loading device 10 has the function of loading wafers 45 on cassette 43 onto boat 44 and includes panel 14 which is backed up by a computer system 100. Panel 14 is equipped with a keyboard where predetermined data can be keyed in, by the operator, as required.

Figure 3:
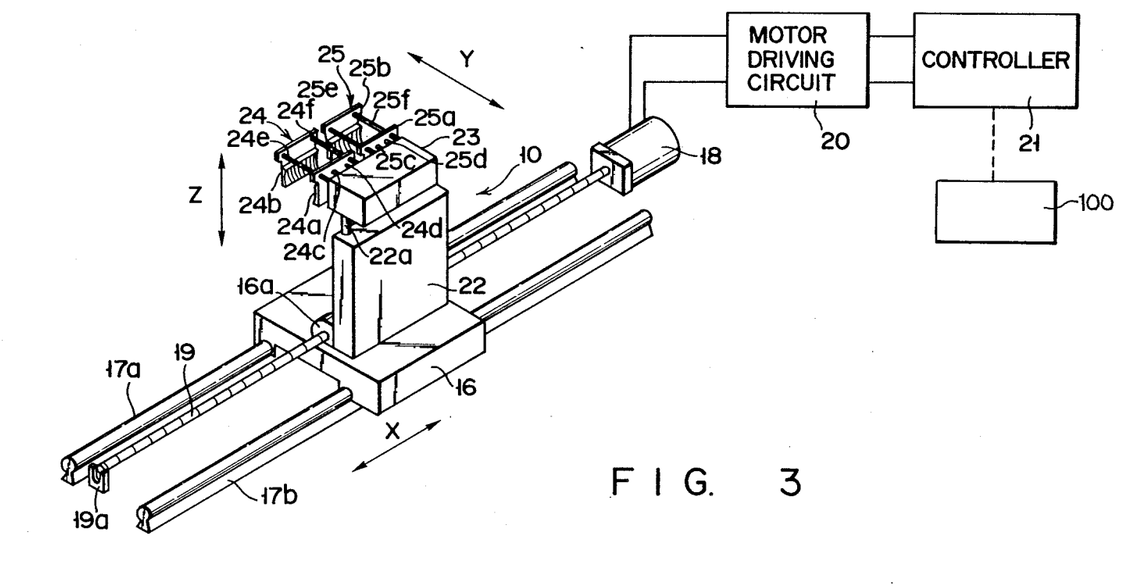
FIG. 3 is a perspective view showing the mechanism of a loading device which is part of the apparatus for transferring wafers.

The respective components and respective drive mechanism of loading device 10 will be explained below with respect to FIG. 3.

A lower mechanism of loading device 10 includes a pair of guide rails 17a, 17b and ball screw 19 arranged parallel to each other in the X-axis direction, pulse motor 18 and slide 16 which is slidably movable in the X-axis direction. Slider 16 spans the pair of guide rails 17a, 17b and supports the upper mechanism of loading device 10. Ball screw 19 is threaded into nut 16a on slider 16 and coupled at one end to the drive axis of pulse motor 18 with the other end of the ball screw 19 supported by member 19a on housing 11.

A switch of motor 18 is connected to motor driving circuit 20 which is, in turn, connected to controller 21. Control 21 is backed up by the computer system 100, and upon the outputting of a predetermined signal from a computer system to motor driving circuit 20 via controller 21, pulse motor 18 is driven, causing slider 16 to be slidably moved in the X-axis direction.

The upper mechanism of loading device 10 will be explained below in more detail.

The upper mechanism of loading device 10 is constructed by a lifting mechanism having first cylinder 22 and a chuck mechanism having second cylinder 23. First cylinder 22 is provided uprightly on slider 16 with the axis of first cylinder 22 extending in the Z-axis direction.

Second cylinder 23 is of a multi-cylinder type having two horizontal drive systems and is coupled via rod 22a to first cylinder 22.

Second cylinder 23 has a parallel array of two opening/closing chucks 24 and 25. That is, four pairs of rods 24c and 24d, 24e and 24f, 25c and 25d, and 25e and 25f extend in the Y direction in a parallel fashion in which two pairs of rods 24c and 24d and 24e and 24f are coupled to a drive shaft of first opening/closing chuck 24 and two pairs of rods 25c and 25d and 25e and 25f are coupled to a drive shaft of second opening/closing chuck 25.

The forward ends of rods 24c and 24d are coupled to plate-like chuck member 24a and the forward ends of rods 24e and 24f are coupled to plate-like chuck member 24b. Chuck members 24a and 24b are provided opposite to each other to provide first opening/closing chuck 24. Similarly, second opening/closing chuck 25 are constructed of an assembly made up of rods 25c and 25d and chuck member 25 and an assembly made up of rods 25e and 25f and chuck member 25b.

Second cylinder 23 includes a plurality of motors, not shown, and a plurality of reduction gears, not shown. In this case, the pair of rods 24c and 24d and pair of rods 24e and 24f are operated in interlocking fashion such that when one pair of rods are projected then the other rod is receded. Rods 24e and 24f extend out of chuck member 24a near to cylinder 23 so as to prevent any mutual interference between chuck member 24a and rods 24e, 24f. Similarly, opening/closing chuck 25 is so constructed as to prevent any mutual interference between rods 25e and 25f and chuck member 25a.

Figure 4:
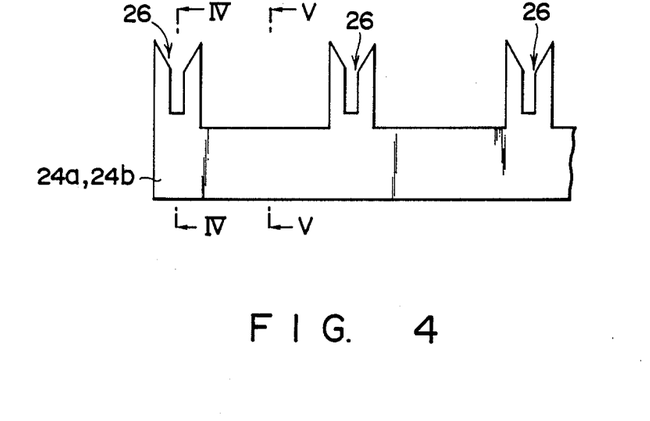
FIG. 4 is a longitudinal view showing a first form of a wafer chuck.
Figure 5:
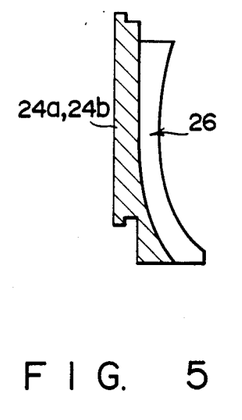
FIG. 5 is a transverse view showing a grooved section of the first wafer chuck.
Figure 6:
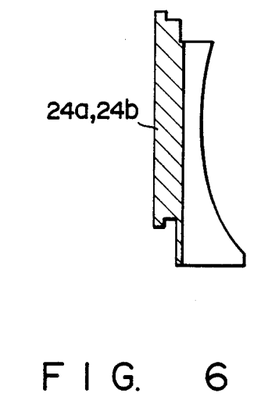
FIG. 6 is a transverse view showing other than the groove of the first wafer chuck.

As shown in FIG. 4, grooves 26 are provided at a pitch of 12/16 inch at the opposite faces of members 24a and 24b of first opening/closing chuck 24 such that a plurality of wafers 45 are each gripped there. The groove 26 is tapered at an open end to allow the wafer to be readily inserted there. As evident from a comparison between FIGS. 5 and 6, groove 26 is so formed as to follow the edge curve of wafer 45.

Figure 7:
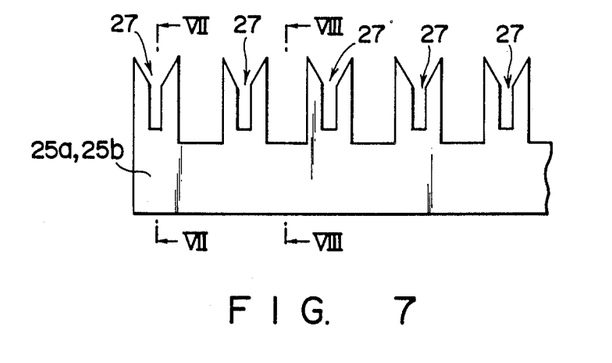
FIG. 7 is a longitudinal view showing a second form of a wafer chuck.
Figure 8:
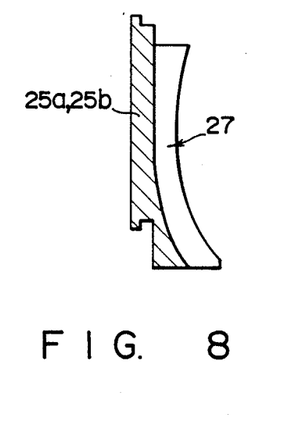
FIG. 8 is a transverse view showing a grooved section of the second wafer chuck.
Figure 9:
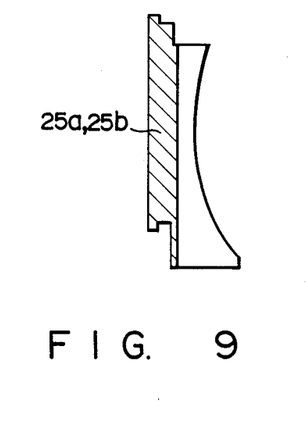
FIG. 9 is a transverse view showing other than the groove of-the second wafer chuck.

As shown in FIG. 7, grooves 27 are provided at a pitch of 6/16 inch at the opposite faces of members 25a and 25b of second opening/closing chuck 25. That is, the distance between grooves 27 of second opening/closing chuck is one half that of groove 26 of first opening/closing chuck. As evident from a comparison between FIGS. 8 and 9, groove 27 is so formed as to follow the edge curve of the wafer. It is to be noted that each groove 27 is substantially the same in configuration as groove 26.

Figure 10:
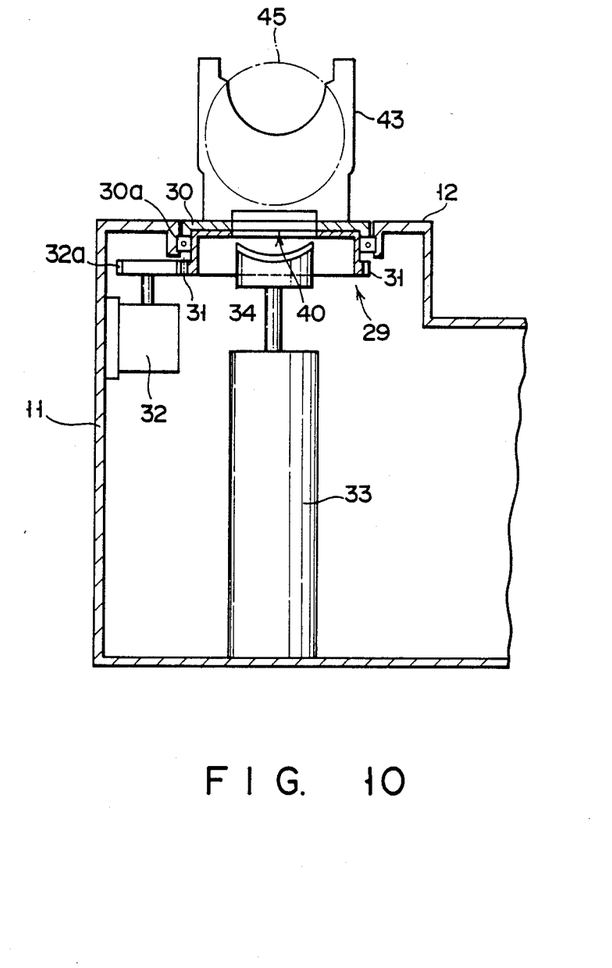
FIG. 10 is a view showing a cassette direction change mechanism and wafer lifting mechanism as viewed from the X-axis direction with a stage partly cut away.

The wafer lifting mechanism and cassette-direction-changing mechanism 29 in the first stage will be explained below with reference to FIG. 10.

Since cassette-direction-changing mechanism 29 are provided in a serial array such that they are arranged in the X-axis direction. Turntable 30 of mechanism 29 is rotatably driven by bearing 30a relative to a frame of stage 12. Gear 31 is located below turntable 30 such that it is in mesh with drive gear 32a of motor 32.

Cylinder 33 of the lifting mechanism is provided immediately below turntable 30. Push-up member 34 is mounted on the forward end of the rod of each cylinder 33 with the wafer holding groove formed at the top surface of push-up member 34.

Opening 40 is formed at the center area of turntable 30 and push-up member 34 of the lifting mechanism can be projected up through opening 40 to allow wafer 45 to be lifted away from cassette 43.

Transferring wafers on cassette 43 to boat 44 will be explained below with reference to FIGS. 11 through 16.

(I) Initial data is keyed in to the computer with six cassettes 43 and one boat 44 disposed in place on the stage. The initial data contains data for rearranging a plurality of wafers 45 from in a face-to-back array to in a face-to-face array. For example, 25 wafers 45 are held at a pitch of 3/16 inch on respective cassette 43 in which case wafer holding grooves of boat 44 are formed at a pitch of 3/16 inch.

A start signal is sent from the computer to controller 21 and loading device 10 is slidably moved in the X-axis direction to position first opening/closing chuck 24 just over first cassette 43.

Figure 11:
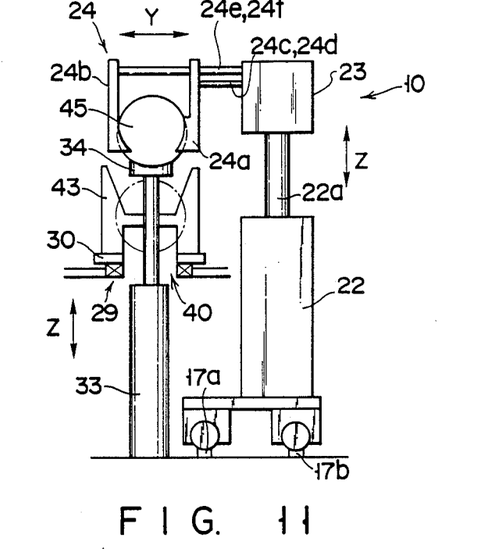
FIG. 11 is a view showing a loading device in the X-axis direction with wafers lifted up from a cassette and gripped by a chuck.

(II) Compressed air is supplied to cylinder 33 in the lifting mechanism, causing push-up member 34 to lift all the wafers (25 sheets of wafer) on the cassette at a time up to the height level of first opening/closing chuck 24. Then compressed air is supplied to cylinder 23 so that rods 24c and 24d extend out of cylinder 23 while rods 24e and 24f are retracted back into cylinder 23. By so doing, wafer 45 is held by opening/closing chuck 24 as shown in FIG. 11.

(III) Upon the lowering of push-up member 34, 18 wafers 45 together with the push-up member are lowered, leaving 7 wafers 45 at the location of opening/closing member 24. That is, wafers 45 are held by first opening/closing chuck 24 at the pitch of 12/16 inch for every four pieces at which time the remaining wafers are returned back to cassette 43.

(IV) Then loading mechanism is slidably moved from first stage 12 to second stage 13 and stopped, in a predetermined position, in front of boat 44. Rod 22a is retracted back into second cylinder 23, lowering second cylinder 23. A sensor, not shown, detects the approach of opening/closing chuck 24 and wafer 45 to boat 44 and first cylinder 22 is stopped based on a result of detection.

Figure 12:
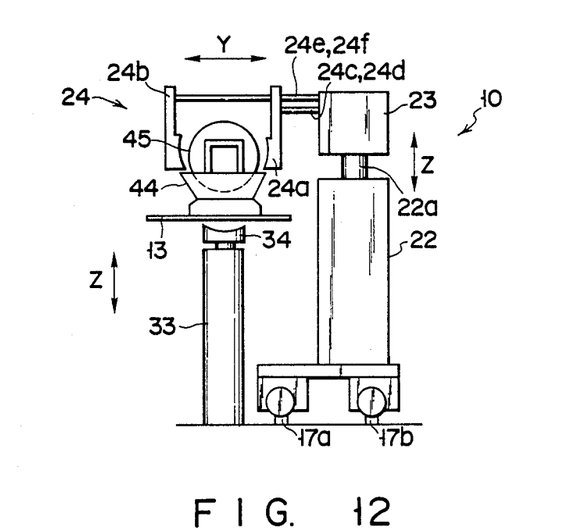
FIG. 12 is a view showing a loading device in the X-axis direction upon the loading of a boat on a wafer.

(V) Then rods 24c and 24d are retracted back into second cylinder 23 and, at the same time, rods 24e and 24f extend out of second cylinder 23. By so doing, wafers 45 are transferred from opening/closing chuck 24 to boat 44 as shown in FIG. 12.

Figure 13:
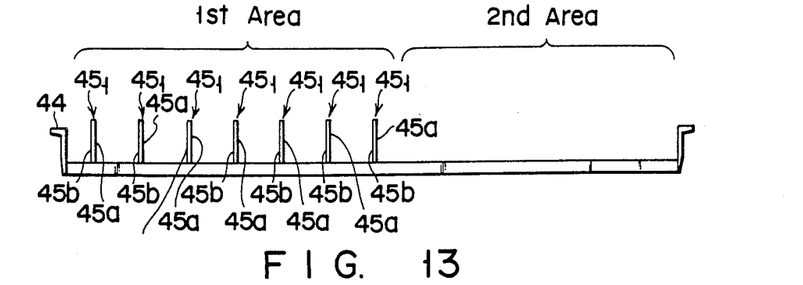
FIGS. 13 to 16 are a model for explaining the steps of transferring wafers in a cassette to a boat so as to obtain a face-to-face array.

As shown in FIG. 13, 7 wafers $45_1$ are loaded onto a first area of boat 44 such that they are oriented in the same direction. That is, wafers $45_1$ on boat 44 are so oriented at a pitch of 12/16 inch with each pattern formation surface 45a of the respective wafer facing a reverse surface 45b of the adjacent wafer.

(VI) Subsequent to the first wafer transfer operation, loading device 10 is slidably moved from second stage 13 to first stage 12, placing first opening/closing chuck 24 at a location just over cassette 43. Motor 32, upon being energized, drives turntable 30 through an angle of 180° to allow cassette 43 to be rotated reversely.

Figure 14:
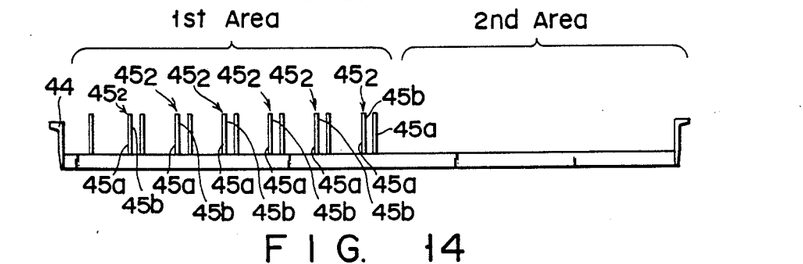

(VII) Upon the supply of compressed air to cylinder 33, wafers 45 on cassette 43 are lifted by push-up member 34 up to a height level of first opening/closing chuck 24. As shown in FIG. 11, wafers 45 are held by first opening/closing chuck 24. Upon the lowering of push-up member 34, 6 wafers 45 are retained at the location of opening/closing chuck 24. The 6 wafers $45_2$ thus retained are conveyed to second stage 13 and, as shown in FIGS. 12 and 14, loaded onto the first area of boat 44.

The 6 sheets of wafer $45_2$ are oriented in the face ($45a$) to face ($45a$) relation to the previously transferred 7 sheets of wafer $45_1$.

Figure 15:
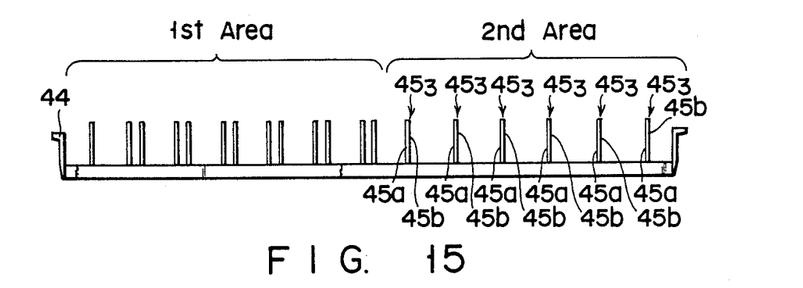

(VIII) Substantially the same operations as set out above are repeated to place a total of 11 wafers 45 from cassette 43 onto the second area of boat 44 in the aforementioned face ($45a$)-to-face ($45a$) relation. That is, as shown in FIG. 15, those wafers $45_3$ (6 sheets) at the third transfer step are oriented in the same direction as that of those wafers $45_2$ (6 sheets) at the second transfer step.

Figure 16:
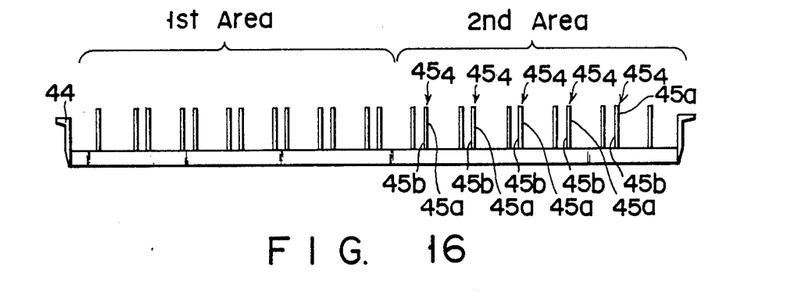

At the fourth transfer step, cassette 43 is reversely rotated by mechanism 29, causing wafers 45 to be turned through an angle of 180°. That is, as shown in FIG. 16, those wafers $45_4$ (5 sheets) at the fourth transfer step are oriented in the same direction as those wafers $45_1$ (7 sheets) at the first transfer step. By so doing, a total of 24 sheets of wafer 45 is loaded onto boat 44 in the face ($45a$)-to-face ($45a$) relation.

(IX) Upon the completion of the wafer transfer operation, boat 44 is conveyed to a "hand-over" position and then up to that available destination self while, at the same time, boat 44 is being held by member 7b of elevator device 7. When this is done, boat 44 is transferred to fork 6 and loaded by soft landing device 5 into the furnace where heat treatment is carried out at a predetermined temperature for a predetermined period of time.

Although, in the aforementioned embodiment, wafers 45 have been explained as being loaded by first opening/closing chuck 24 onto boat 44 having grooves formed at a pitch of 3/16 inch, this operation can also be performed when the pitch of the boat's grooves is changed to 3/32 inch. That is, since the wafer transfer apparatus has, in addition to first opening/closing chuck 24, second opening/closing chuck 25, wafers can be transferred by second opening/closing chuck 25 onto the boat whose grooves are formed at a pitch of 3/32 inch. It is, therefore, possible according to the present invention to transfer wafers onto a desired one of several kinds of boats, without changing opening/closing chucks, whose grooves are different in pitch.

Although, in the aforementioned embodiment, wafers have been explained as being transferred to the boat in the aforementioned face-to-face relation, the present invention is not restricted to the aforementioned embodiment. For example, various desired arrays of wafers can be obtained by turning wafers by cassette rotation mechanism 29 in various directions.

It is possible, according to the present invention, to obtain various advantages as set out below.

According to the present invention, wafers can be transferred in a full automatic fashion to the boat in the aforementioned face-to-face relation. In the situations where wafers have to be differently oriented on the boat in terms of the heat treatment specification adopted, the present invention can adequately be employed to cope with such situations and hence to assure a wider field of application.

It is possible, according to the present invention, to transfer wafers to various types of boats with the use of a single wafer transfer apparatus and to obviate the necessity of changing component parts. For this reason, even if the wafer holding pitch of the grooves of the boat is changed from 3/16 inch to 3/32 inch, wafers can be transferred by the same apparatus from the cassette to the boat, thus saving a component exchange time and hence assuring an operation efficiency of the apparatus.

What is claimed is:

1. An apparatus for transferring wafers, comprising:
   taking out means for taking out a first array of wafers held in a same direction from a cassette, and then a second array of wafers from a cassette;
   turning means for turning the wafers of said first array and the wafers of said second array; and
   combining means for combining the wafers of said first array and the wafers of said second array so that those surfaces of the wafers of said first array, on which patterns are formed, oppose those surfaces of the wafers of said second array on which patterns are formed.

2. The apparatus according to claim 1, wherein said turning means is a turntable for allowing said wafers of said first and second array to be rotated around a vertical axis.

3. The apparatus according to claim 2, wherein said turntable is rotated around said vertical axis through an angle of 180°.

4. The apparatus according to claim 1, including a plurality of turning means arranged in a serial array.

5. The apparatus according to claim 1, wherein said turning means is controlled by a computer system to allow said wafers to be selectively turned by said turning means based on a predetermined computer programming.

6. The apparatus according to claim 1, wherein said combining means comprises holding means for selectively holding the wafers, wherein said holding means has a plurality of opening/closing chuck mechanisms.

7. The apparatus according to claim 6, wherein said plurality of opening/closing chuck mechanisms, each, include a pair of wafer-holding members having a a plurality of grooves formed at an equal interval.

8. The apparatus according to claim 7, wherein said plurality of opening/closing chuck mechanisms, each, have wafer-holding members whose grooves are different for each chuck mechanism.

9. The apparatus according to claim 6, wherein said holding means is controlled by a computer system to allow a predetermined one of said plurality of opening/closing chuck mechanisms which is operated to be selected based on a predetermined computer programming.

10. The apparatus according to claim 1, wherein said taking out means is constructed as a lifting mechanism for lifting said wafers all at a time.

11. The apparatus according to claim 10, wherein said lifting mechanism is located below said turning means.

12. The apparatus according to claim 6, wherein said taking out means is computer-controlled so that it is operated in interlock with said holding means.

13. The apparatus according to claim 1, wherein said combining means is computer-controlled.

14. The apparatus according to claim 1, wherein said turning means is computer-controlled such that it is operated in interlock with said taking out means.

15. A method for transferring wafers, comprising:
   a first transferring step of lifting a first array of wafers held in a same direction in a first carrier, holding the wafers, and loading a second carrier with the wafers;
   a second transferring step of lifting a second array of wafers from the first carrier, holding the wafers, and loading the second carrier with said wafers, wherein the wafers of said first array oppose the wafers of said second array.

16. The method according to claim 15, comprising the further step of turning said first carrier.

17. The method according to claim 15, comprising the further step of turning the wafers of said first array or the wafers of the second array.

18. The method according to claim 15, wherein the wafers of said first array or the wafers of said second array are turned, while held in the carrier.

* * * * *